United States Patent
Hauptmann et al.

(10) Patent No.: US 12,276,919 B2
(45) Date of Patent: Apr. 15, 2025

(54) METHOD FOR CONTROLLING A SEMICONDUCTOR MANUFACTURING PROCESS

(71) Applicant: ASML NETHERLANDS B.V., Veldhoven (NL)

(72) Inventors: Marc Hauptmann, Turnhout (BE); Cornelis Johannes Henricus Lambregts, Geldrop (NL); Amir Bin Ismail, Eindhoven (NL); Rizvi Rahman, Eindhoven (NL); Allwyn Boustheen, Eindhoven (NL); Raheleh Pishkari, Eindhoven (NL); Everhardus Cornelis Mos, Best (NL); Ekaterina Mikhailovna Viatkina, Eindhoven (NL); Roy Werkman, Eindhoven (NL); Ralph Brinkhof, Vught (NL)

(73) Assignee: ASML NETHERLANDS B.V., Veldhoven (NL)

( * ) Notice: Subject to any disclaimer, the term of this patent is extended or adjusted under 35 U.S.C. 154(b) by 403 days.

(21) Appl. No.: 17/635,290

(22) PCT Filed: Jul. 16, 2020

(86) PCT No.: PCT/EP2020/070151
§ 371 (c)(1),
(2) Date: Feb. 14, 2022

(87) PCT Pub. No.: WO2021/032376
PCT Pub. Date: Feb. 25, 2021

(65) Prior Publication Data
US 2022/0236647 A1    Jul. 28, 2022

(30) Foreign Application Priority Data
Aug. 20, 2019 (EP) .................................. 19192577

(51) Int. Cl.
*G03F 7/00* (2006.01)

(52) U.S. Cl.
CPC .......... *G03F 7/70525* (2013.01); *G03F 7/705* (2013.01); *G03F 7/70508* (2013.01); *G03F 7/70633* (2013.01); *G03F 7/7065* (2013.01)

(58) Field of Classification Search
None
See application file for complete search history.

(56) References Cited

U.S. PATENT DOCUMENTS

| 6,952,253 B2 | 10/2005 | Lof et al. |
| 10,409,171 B2 | 9/2019 | Adel et al. |

(Continued)

FOREIGN PATENT DOCUMENTS

| CN | 104934338 | 9/2015 |
| EP | 1744217 | 1/2007 |

(Continued)

OTHER PUBLICATIONS

Peterson, "Lithography Overlay Control Improvement using Patterned Wafer Geometry for sub 22 nm technology nodes", 2015, SPIE vol. 9424, pp. 1,4,9 (Year: 2015).*

(Continued)

*Primary Examiner* — David Earl Ogg
(74) *Attorney, Agent, or Firm* — Pillsbury Winthrop Shaw Pittman, LLP

(57) ABSTRACT

A method of controlling a semiconductor manufacturing process, the method including: obtaining first metrology data based on measurements performed after a first process step; obtaining second metrology data based on measurements performed after the first process step and at least one additional process step; estimating a contribution to the process of: a) a control action which is at least partially based on the second metrology data and/or b) the at least one (Continued)

additional process step by using at least partially the second metrology data; and determining a Key Performance Indicator (KPI) or a correction for the first process step using the first metrology data and the estimated contribution.

20 Claims, 5 Drawing Sheets

(56) References Cited

U.S. PATENT DOCUMENTS

| | | | |
|---|---|---|---|
| 10,545,410 B2 | 1/2020 | Cekli et al. | |
| 2006/0016561 A1 | 1/2006 | Choi et al. | |
| 2007/0021860 A1* | 1/2007 | Gertrudus Simons | G03F 9/7011 700/121 |
| 2007/0076205 A1* | 4/2007 | Schulz | G03F 7/70683 257/E23.179 |
| 2010/0214550 A1 | 8/2010 | Hulsebos et al. | |
| 2012/0008127 A1 | 1/2012 | Tel et al. | |
| 2012/0303151 A1* | 11/2012 | Ye | G05B 13/04 700/119 |
| 2013/0035888 A1* | 2/2013 | Kandel | G03F 7/70633 702/81 |
| 2015/0185625 A1* | 7/2015 | Chen | G03F 7/70683 702/182 |
| 2016/0299438 A1* | 10/2016 | Mos | G06F 3/0482 |
| 2017/0287751 A1* | 10/2017 | Kuznetsov | G03F 7/70633 |
| 2018/0046737 A1* | 2/2018 | Willems | G03F 7/70683 |
| 2018/0253017 A1 | 9/2018 | Adel et al. | |
| 2018/0348649 A1 | 12/2018 | Holovinger et al. | |
| 2019/0243252 A1 | 8/2019 | Frisco et al. | |

FOREIGN PATENT DOCUMENTS

| | | |
|---|---|---|
| EP | 3312672 | 4/2018 |
| EP | 3312693 | 4/2018 |
| EP | 3495889 | 6/2019 |
| WO | 2011081645 | 7/2011 |
| WO | 2013092106 | 6/2013 |
| WO | 2015101458 | 7/2015 |
| WO | 2015110191 | 7/2015 |
| WO | 2017060080 | 4/2017 |
| WO | 2019120826 | 6/2019 |

OTHER PUBLICATIONS

International Search Report and Written Opinion issued in corresponding PCT Patent Application No. PCT/EP2020/070151, dated Nov. 9, 2020.

* cited by examiner

METHOD FOR CONTROLLING A SEMICONDUCTOR MANUFACTURING PROCESS

CROSS-REFERENCE TO RELATED APPLICATIONS

This application is the U.S. national phase entry of PCT Patent Application No. PCT/EP2020/070151 which was filed on Jul. 16, 2020, which is based upon and claims the benefit of priority of European Patent Application No. 19192577.5 which was filed on Aug. 20, 2019, and which is incorporated herein in its entirety by reference.

FIELD

The present invention relates to a method for controlling a semiconductor manufacturing process.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

It is often necessary to line-up a comprehensive metrology measurement infra-structure to continuously measure characteristics of substrates subject to the process and features applied to said substrates. The metrology data is typically fed to process monitoring and process control equipment configured to stabilize the lithographic apparatus.

Current methods of controlling and/or monitoring a semiconductor manufacturing process using the lithographic apparatus are based on determining a Key Performance Indicator (KPI) or process correction by analysis and modelling of metrology data obtained at various stages of the manufacturing process. Often the sampling scheme and density of the metrology data associated with the various stages are not identical; for example overlay data measured after a resist development step is measured frequently, but has a sparse sampling layout, while overlay data measured after an etch step is measured less frequent, but typically has a very dense sampling layout. The after development metrology data (After Development Inspection metrology data, so-called ADI metrology data) is typically used for monitoring and/or correcting overlay across the entire substrate (global correction) during a lot based control (run-to-run control) or lot-based KPI determination, while the high density after-etch metrology data (After Etch Inspection metrology data, so-called AEI metrology data) is useful for correcting overlay at a more local substrate level, for example within individual exposure fields provided to the substrates (so-called Corrections Per Exposure, CPE).

When using such a heterogenous set of overlay data for purposes of process control and/or process monitoring it is advantageous to configure the control and/or monitoring architecture such that commonality in content between different sets of overlay does not cause any process performance (overlay) instabilities and/or erroneous (overlay) KPI determination.

SUMMARY

It is an object of the invention to prevent sub-optimal process control and/or sub-optimal KPI determination in case the process controller is configured to receive metrology data input associated with at least two stages of processing.

In an aspect of the invention a method of controlling a semiconductor manufacturing process is provided, the method comprising: obtaining first metrology data based on measurements performed after a first process step; obtaining second metrology data based on measurements performed after the first process step and at least one additional process step; estimating a contribution to the process of a control action which is at least partially based on the second metrology data and/or b) the at least one additional process step by using at least partially the second metrology data; and determining a Key Performance Indicator (KPI) or a correction for the first process step using the first metrology data and the estimated contribution.

By estimating the contribution of a control action and/or a process step different from the first process step to the process and taking the contribution into account when determining a KPI or correction for the first process step it is prevented that controlling the first process step may become instable, while a KPI associated with the first process step is intrinsically better decoupled from the influence of additional process steps.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
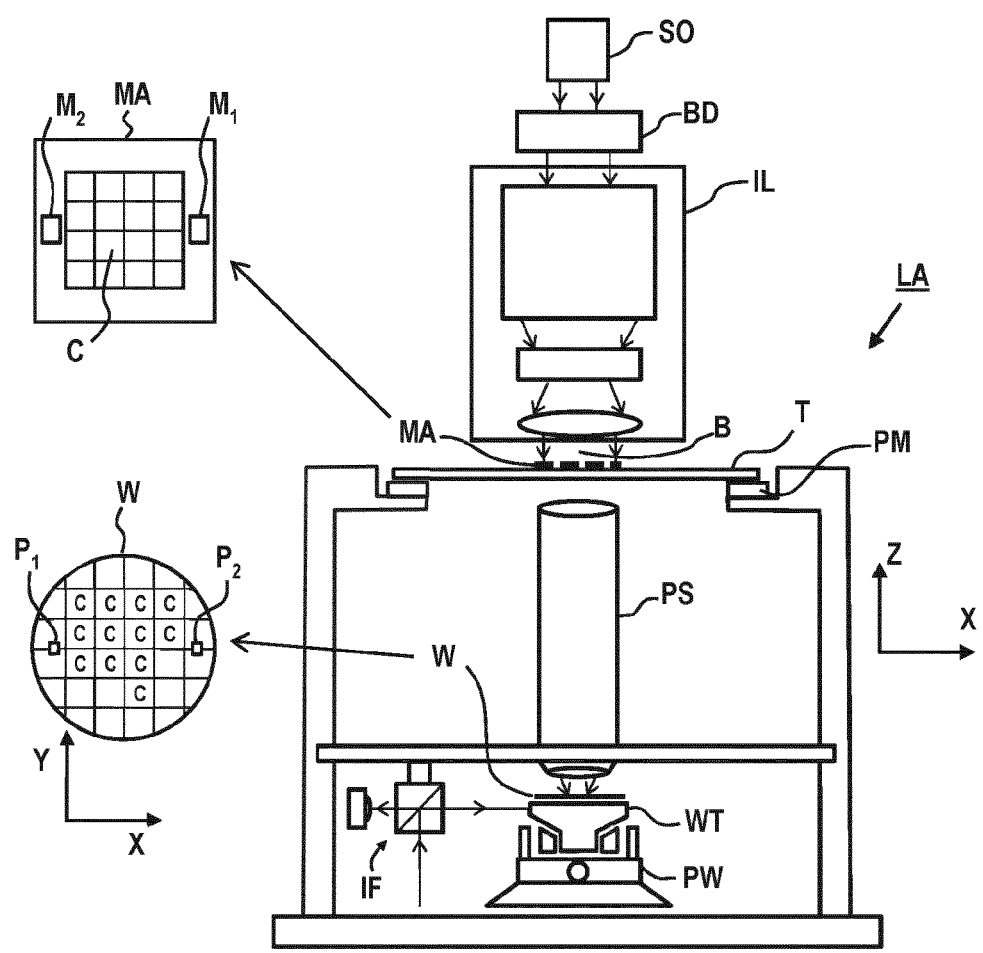
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
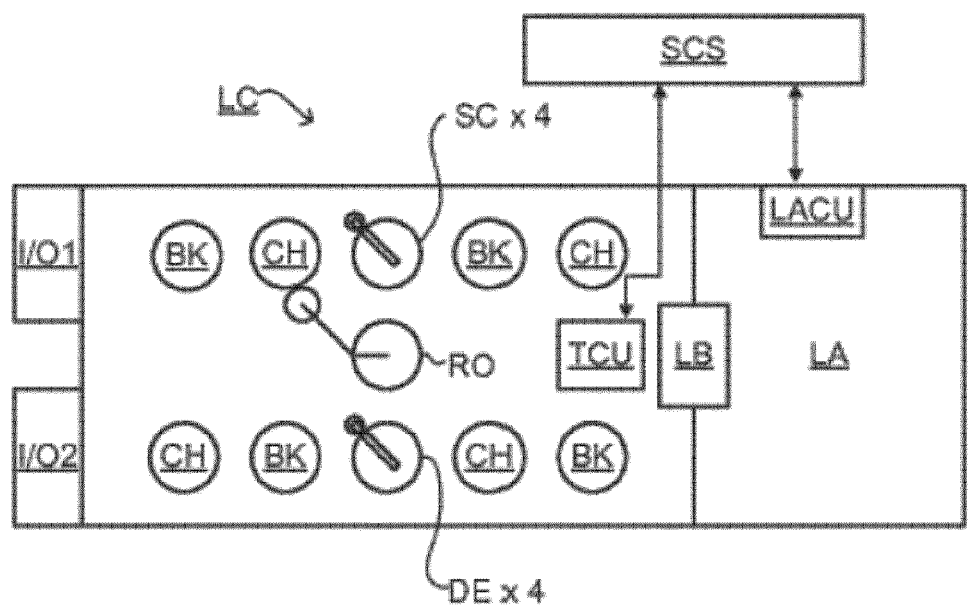
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
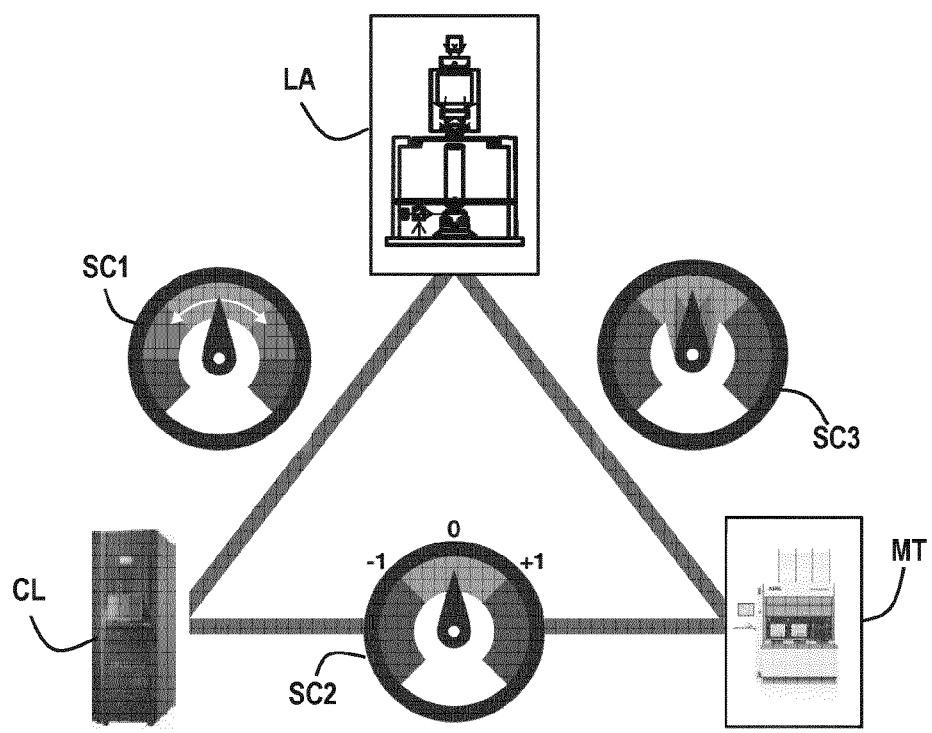
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

The lithographic apparatus LA is configured to accurately reproduce the pattern onto the substrate. The positions and dimensions of the applied features need to be within certain tolerances. Position errors may occur due to an overlay error (often referred to as "overlay"). The overlay is the error in placing a first feature during a first exposure relative to a second feature during a second exposure. The lithographic apparatus minimizes the overlay errors by aligning each wafer accurately to a reference prior to patterning. This is done by measuring positions of alignment marks on the substrate using an alignment sensor. More information on the alignment procedure can be found in U.S. Patent Application Publication No. US20100214550, which is incorporated herein by reference. Pattern dimensioning (CD) errors may e.g. occur when the substrate is not positioned correctly with respect to a focal plane of the lithographic apparatus. These focal position errors may be associated with un-flatness of a substrate surface. The lithographic apparatus minimizes these focal position errors by measuring the substrate surface topography prior to patterning using a level sensor. Substrate height corrections are applied during subsequent patterning to assure correct imaging (focusing) of the patterning device onto the substrate. More information on the level sensor system can be found in U.S. Patent Application Publication No. US20070085991, which is incorporated herein by reference.

Besides the lithographic apparatus LA and the metrology apparatus MT other processing apparatus may be used during IC production as well. An etching station (not shown) processes the substrates after exposure of the pattern into the resist. The etch station transfers the pattern from the resist into one or more layers underlying the resist layer. Typically etching is based on application of a plasma medium. Local etching characteristics may e.g. be controlled using temperature control of the substrate or directing the plasma medium using a voltage controlled ring. More information on etching control can be found in international Patent Application Publication No. WO2011081645 and U.S. Patent Application Publication No. US 20060016561 which are incorporated herein by reference.

During the manufacturing of the ICs it is of great importance that the process conditions for processing substrates using processing apparatus such as the lithographic apparatus or etching station remain stable such that properties of the features remain within certain control limits. Stability of the process is of particular importance for features of the functional parts of the IC, the product features. To guarantee stable processing, process control capabilities need to be in place. Process control involves monitoring of processing data and implementation of means for process correction, e.g. control the processing apparatus based on characteristics of the processing data. Process control may be based on periodic measurement by the metrology apparatus MT, often referred to as "Advanced Process Control" (further also referenced to as APC). More information on APC can be found in U.S. Patent Application Publication No. US20120008127, which is incorporated herein by reference. A typical APC implementation involves periodic measurements on metrology features on the substrates to monitor and correct drifts associated with one or more processing apparatus. The metrology features reflect the response to process variations of the product features. The sensitivity of the metrology features to process variations may be different compared to the product features. In that case a so-called "Metrology To Device" offset (further also referenced to as MTD) may be determined. To mimic the behavior of product features the metrology targets may incorporate segmented features, assist features or features with a particular geometry and/or dimension. A carefully designed metrology target should respond in a similar fashion to process variations as the product features. More information on metrology target design can be found in international Patent Application Publication No. WO 2015101458 which is incorporated herein by reference.

The distribution of the locations across the substrate and/or patterning device where the metrology targets are present and/or measured is often referred to as the "sampling scheme". Typically the sampling scheme is selected based on an expected fingerprint of the relevant process parameter(s); areas on the substrate where a process parameter is expected to fluctuate are typically sampled more densely than areas where the process parameter is expected to be constant. Further there is a limit to the number of metrology measurements which may be performed based on the allowable impact of the metrology measurements on the throughput of the lithographic process. A carefully selected sampling scheme is important to accurately control the lithographic process without affecting throughput and/or assigning a too large area on the reticle or substrate to metrology features. Technology related to optimal positioning and/or measuring metrology targets is often referred to as "scheme optimization". More information on scheme optimization can be found in international Patent Application Publication No. WO 2015110191 and the European patent application, application number EP16193903.8 which are incorporated herein by reference.

Besides metrology measurement data also context data may be used for process control. Context data may comprise data relating to one or more of: the selected processing tools (out of the pool of processing apparatus), specific characteristics of the processing apparatus, the settings of the processing apparatus, the design of the circuit pattern and measurement data relating to processing conditions (for example wafer geometry). Examples of using context data for process control purposes may be found in the European patent application, application number EP16156361.4, and the international patent application, application number PCT/EP2016/072363 which are incorporated herein by reference. Context data may be used to control or predict processing in a feed-forward manner in case the context data relates to process steps performed before the currently controlled process step. Often context data is statistically correlated to product feature properties. This enables context driven control of processing apparatus in view of achieving optimal product feature properties. Context data and metrology data may also be combined e.g. to enrich sparse metrology data to an extent that more detailed (dense) data becomes available which is more useful for control and/or diagnostic purposes. More information on combining context data and metrology data can be found in U.S. Patent provisional, application No. 62/382,764 which is incorporated herein by reference.

As said monitoring the process is based on acquisition of data related to the process. The required data sampling rate (per lot or per substrate) and sampling density depend on the required level of accuracy of pattern reproduction. For low-k1 lithographic processes even small substrate to substrate process variations may be significant. The context data and/or metrology data then need to enable process control on a per substrate basis. Additionally when a process variation gives rise to variations of a characteristic across the substrate the context and/or metrology data need to be sufficiently densely distributed across the substrate. However the time available for metrology (measurements) is limited in view of the required throughput of the process. This limitation imposes that the metrology tool may measure only on selected substrates and selected locations across the substrate. The strategies to determine what substrates need to be measured are further described in the European patent applications, application number EP16195047.2 and EP16195049.8 which are incorporated herein by reference.

In practice it is often necessary to derive from a sparse set of measurement values relating to a process parameter (across a substrate or plurality of substrates) a denser map of values associated with the substrate(s). Typically such a dense map of measurement values may be derived from the sparse measurement data in conjunction with a model associated with an expected fingerprint of the process parameter. More information on modeling measurement data can be found in international Patent Application Publication No. WO 2013092106 which is incorporated herein by reference.

More modern process control architectures are based on at least two streams of metrology data inputs. A first stream of metrology data is typically based on frequently measured (2-4 substrates measured per lot, each lot typically containing 25 substrates) substrates and a second stream of metrology data based on less frequently measured data (not for every lot, but typically once every 10-30 lots). The first stream of metrology data normally comprises sparsely measured data, for example 200 data points of overlay error distributed evenly across a substrate. Typically the first stream of data is associated with metrology measurements performed on metrology marks formed during at least an exposure and resist development step. Such data is referred to as After Development Inspection (ADI) data which is typically used as the workhorse for determining process correction on a lot to lot base; ADI metrology data is modeled and used to derive corrections (control actions) for the upcoming lot of to be processed substrates. However the first stream of metrology data is normally not densely measured and hence less suitable to derive process corrections targeted to correct deviating process behavior across smaller regions on the substrates, such as individual (exposure) fields on the substrates.

In addition to the first stream of metrology data (first metrology data) often a second stream of metrology data (second metrology data) is provided to the process control and/or monitoring infrastructure. The second metrology data is typically measured for a few substrates only once every 5-30 lots, but comprises typically 400-2000 data points of overlay error distributed across the substrate. The second metrology data is more suitable to derive control actions targeted to correct overlay errors at spatial scales which are not picked up by control actions derived from the first metrology data.

The second metrology data may also be ADI data, but may also be After-Etch Inspection (AEI) metrology data. The second metrology data may be based on measurements performed on product features instead of metrology marks. In case the first metrology data is ADI data and the second metrology data is AEI data they both may differ significantly in content, the second metrology data including contribution of the etch process to the metrology data. In some cases hence also third metrology data may be obtained, the third metrology data being dense ADI data. This would allow determination of the contribution of the etch process to the metrology data. This contribution may then later be added to the sparse and/or dense ADI metrology data to obtain a prediction of associated AEI metrology data.

The control actions targeted to correct overlay errors across the entire wafer (based on the first metrology data) and the control actions targeted to correct overlay errors across a die, field or other region on the substrate are typically applied during APC corrections, wherein the first metrology data is modeled and used for the global substrate fingerprint correction and the second metrology data modeled as a field specific fingerprint correction (Correction Per Exposure).

The model used to describe the first metrology data (per substrate) is normally a global model configured to describe a global shape of an overlay error across a substrate. The model used to describe the second metrology data (per region on the substrate) is normally a higher order model configured to describe an intra-field (local) fingerprint of an overlay error for one or more specific exposure fields.

However the models for describing the first and second metrology data are normally not orthogonal, which causes that local control actions derived at least partially from the (modeled) second metrology data are in general affecting the modeling of the global fingerprint associated with the first metrology data. Any global control action and/or KPI determined from the modeled first metrology data will therefore respond to an update of the local control action triggered by the availability of new second metrology data. This is undesired behavior as this may result in unstable process control and process monitoring (KPI will demonstrate 'jumps' leading to erroneous process evaluation).

Figure 4A:
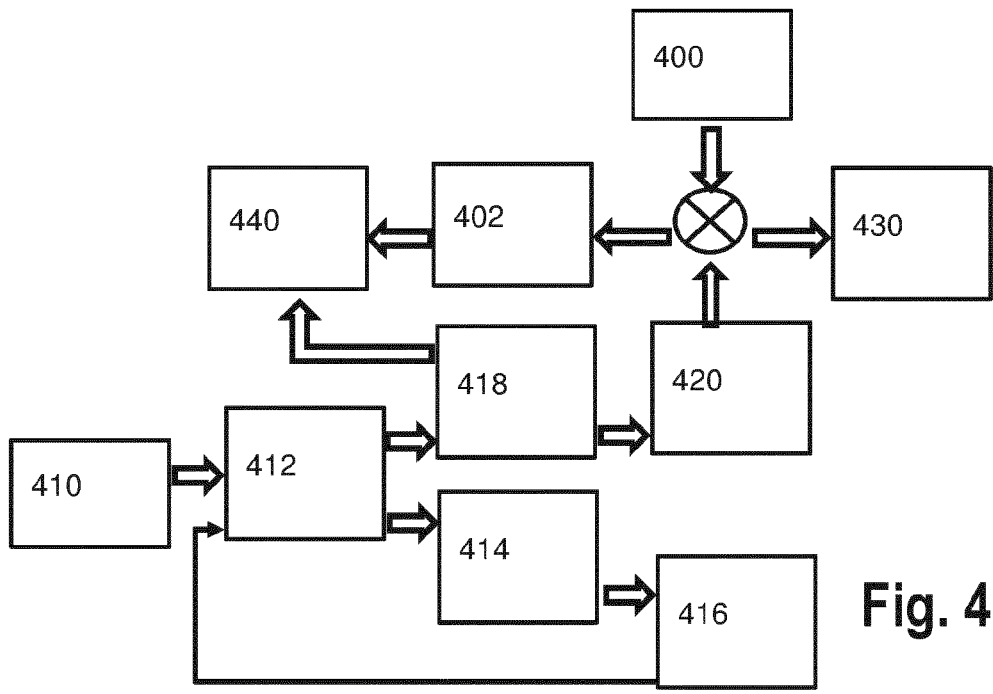
FIG. 4a depicts a first process flow according to an embodiment of the invention.

FIG. 4 illustrates a process control/monitoring flow according to an embodiment of the invention. First (sparse) metrology data 400 is available which is suitable to derive a correction 402 for run-to-run (APC based) control of multiple lots of substrates (wafers). Second (dense) metrology data 410 is available, for example based on dense ADI or dense AEI metrology data. Before deriving a CPE correction the second metrology data 410 may be de-corrected for any (CPE and lower order) corrections applied during the exposure of the substrates of interest. Subsequently content of the de-corrected data 412 which is correctable by global control actions is removed by: 1) downsampling the second metrology data to the measurement grid of the first metrology data to obtain downsampled and decorrected second metrology data 414 and 2) estimating the global control action 416 using the decorrected metrology data 414 and control characteristics of the lithographic apparatus and 3) subtracting the effect of the global control action 416 from the de-corrected second metrology data 412 to derive a CPE correction 418 which is combined with the global correction 402 in order to derive a control action 440 suitable for controlling a subsequent lot of substrates.

To prevent any crosstalk between the derived CPE correction 418 and the global correction 402, the first metrology data 400 is first de-corrected for the CPE correction 418. This is implemented by down-sampling the fingerprint of the correction 418 to the measurement grid (sampling layout) of the first metrology data 400 and subsequently subtracting the down-sampled correction fingerprint 420 from the first metrology data 400 to obtain the global correction 402 which is suitable to be combined with the CPE correction 418 to derive the control action 440.

In addition to using the down-sampled CPE correction fingerprint for control purposes, it is also used to be combined with the first metrology data 400 to derive a KPI 430 associated with the first metrology data.

Figure 4B:
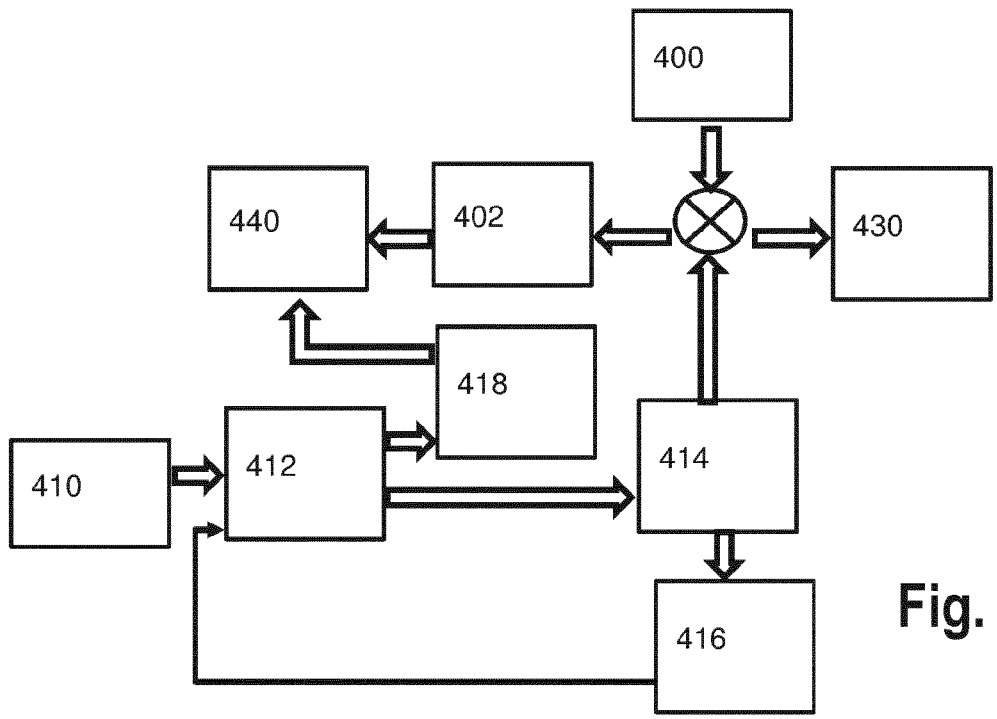
FIG. 4b depicts a second process flow according to an embodiment of the invention.

Alternatively the flow of FIG. 4b is followed, instead of down-sampling the fingerprint of the CPE correction (e.g. taking correction range of actuators into account) the down-sampled and de-corrected dense fingerprint 414 is subtracted from the first metrology data 400 to derive the global correction 402 and the KPI 430. Alternatively instead of subtracting the down-sampled fingerprint 414 directly the fingerprint 414 may be modeled first and subsequently the modeled fingerprint may be subtracted from the first metrology data 400, or model parameters associated with fingerprint 414 may be subtracted from model parameters associated with fingerprint 400.

The second metrology data 410 may be, as stated previously, ADI or AEI data, the latter measured after one or more process steps (such as CMP and/or etching) performed subsequently to resist development, after which the first metrology data 400 had been measured. Hence the second metrology data 410 may contain content describing the effect of the subsequent process step on a fingerprint of a performance parameter, such as overlay (error). Apart from use in deriving a CPE correction 418 to the ADI first metrology data, the AEI second metrology data may be used to derive a so-called Metrology To Device (MTD) offset to determine the difference between performance (typically overlay error) of etched features and features when still in resist (ADI measurement data). The MTD offset comprises the contribution of an additional process step (typically etch step) to a fingerprint of the performance parameter of interest.

The additional process step may be any of a cleaning, deposition, etching, polishing or any other relevant process step. The additional step may be performed after the development step, or may be performed before the development step. In case the first metrology data is ADI overlay data and the second data is AEI overlay data, the additional process step may be for example a process step performed before the etch step, such as a deposition step, but which effect on the overlay fingerprint will be revealed only when the (dense) AEI measurement (second metrology data) becomes available.

In an embodiment of the invention a method of controlling a semiconductor manufacturing process is provided, the method comprising: obtaining first metrology data based on measurements performed after a first process step; obtaining second metrology data based on measurements performed after the first process step; estimating a contribution to the process of a control action which is at least partially based on the second metrology data; and determining a Key Performance Indicator (KPI) or a correction for the first process step using the first metrology data and the estimated contribution.

In an embodiment of the invention a method of controlling a semiconductor manufacturing process is provided, the method comprising: obtaining first metrology data based on measurements performed after a first process step; obtaining second metrology data based on measurements performed after the first process step and at least one additional process step; estimating a contribution to the process of: a) a control action which is at least partially based on the second metrology data and/or b) the at least one additional process step by using at least partially the second metrology data; and determining a Key Performance Indicator (KPI) or a correction for the first process step using the first metrology data and the estimated contribution.

In an embodiment the first and second metrology data comprise overlay data measured on one or more substrates being subject to the process.

In an embodiment the first process step is development of a photosensitive resist applied to the one or more substrates and the at least one additional process step comprises at least an etching, polishing or cleaning step performed on the one or more substrates.

In an embodiment the overlay data comprised within the first metrology data is distributed sparsely across the one or more substrates compared to the overlay data comprised within the second metrology data.

In an embodiment the estimated contribution is associated with the control action and the estimating comprises mapping the expected effect of the control action to a grid layout associated with the first metrology data and the determining of the KPI comprises subtracting the mapped effect of the control action from the overlay data comprised within the first metrology data.

In an embodiment the estimating of the contribution to the process of the control action takes the correction potential of an apparatus, for example a lithographic apparatus, used in the first process step into account.

In an embodiment the method further comprises configuring the semiconductor manufacturing process using overlay data obtained by subtracting the mapped effect of the control action from the overlay data comprised within the first metrology data.

In an embodiment the estimated contribution is associated with the control action and the estimating comprises modeling the expected effect of the control action to a high order modeled fingerprint and the determining of the KPI comprises correcting the overlay data comprised within the first metrology data using the high order modeled fingerprint.

In an embodiment the method further comprises configuring the semiconductor manufacturing process using the corrected overlay data obtained by correcting the overlay data comprised within the first metrology data using the high order modeled fingerprint.

In an embodiment the first metrology data is input for a first model used in controlling the process and the second metrology data is input for a second model used in controlling the process.

In an embodiment the first model describes a global fingerprint of a parameter across a substrate and the second model describes a local fingerprint of the parameter across a region of the substrate.

In an embodiment the region is a field on the substrate.

In case the second metrology data 410 is AEI data, as indicated above, the second metrology data may also be used to derive a MTD offset associated with characteristics of an additional process step, such as CMP (Chemo Mechanical Polishing), deposition of material(s), etching and cleaning. Since the etching step is performed between the ADI and AEI measurement, typically the MTD offset relates to an etch induced fingerprint contribution.

Further the AEI data (second metrology data) is typically more dense and hence suitable to derive CPE corrections. In analogy to the method as depicted by FIG. 4b the second metrology data may be down-sampled and subtracted from the ADI data (first metrology data) to prevent unstable ADI-AEI based control and/or determination of an erroneous KPI.

Figure 5:
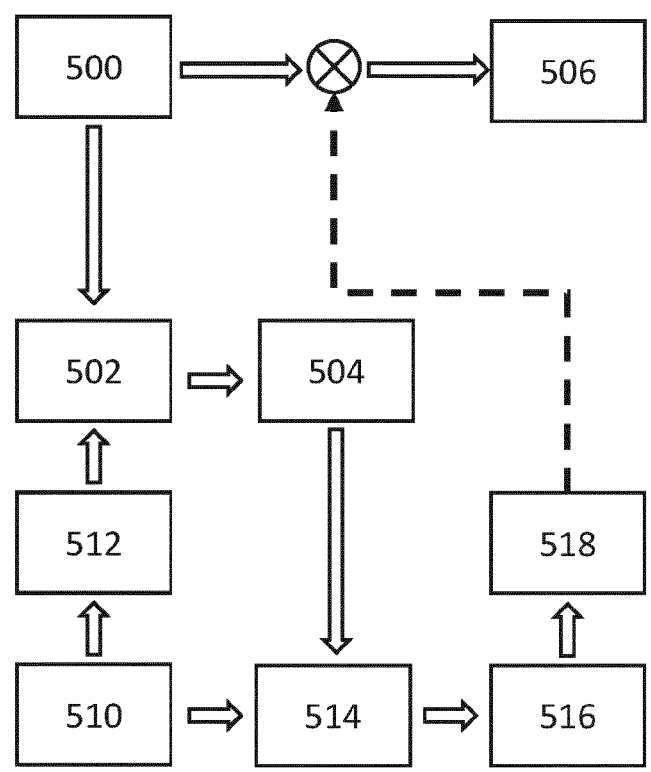
FIG. 5 depicts a third process flow according to an embodiment of the invention.

A process flow according to an aspect of the invention is depicted in FIG. 5. ADI first metrology data 500 and AEI second metrology data 510 is available. The AEI second metrology data is downsampled to match the grid of the ADI first metrology data 500 and subsequently used to determine an MTD offset contribution 512. The MTD offset (fingerprint) is added to the ADI data to obtain data 502 which is more representative for (in this case) after etch performance and for the purpose of process control and/or monitoring (KPI determination). The data 502 is modeled and subsequently evaluated on the dense grid associated with the AEI data 510 to obtain densified data 504. The densified data is subtracted from the AEI data 510 to obtain remaining AEI data 514. The remaining AEI data is used as input to a CPE model to determine CPE content 516. The CPE model 516 is evaluated on the sparse grid associated with the ADI data 500 to obtain a corrective Non-Zero Offset (NZO) 518 that is subtracted from the ADI data 500 to obtain corrected ADI data 506. The data 506 is corrected for any mismatch between the sparse ADI data 500 and dense AEI data 510 and is usable for deriving lower order corrections with a strongly reduced risk of crosstalk to contents which are picked up by CPE corrections. The corrected ADI data 506 may further be combined with the MTD offset contribution 512 to derive a more effective (lower) order correction by taking expected etch contributions into account. The CPE content 516 may be used as input for CPE corrections.

According to another aspect of the invention the ADI data 500 is first densified by mapping the sparse data to the dense sampling layout associated with the second (AEI) metrology data, using any suitable interpolation and/or extrapolation technique. The MTD offset 512 is added to the ADI data 500 prior to the densification to derive a better prediction for the after etch performance (overlay). In case the MTD data relates to a previous lot of substrates a so-called defense system may be designed. ADI data from a current lot is combined with a stored MTD offset associated with a previous lot to predict an after etch fingerprint of overlay (or any other relevant performance parameter). In case the predicted after etch overlay error is larger than a threshold it may be decided to re-work the lot of substrates instead of proceeding with processing (etching) of the lot of substrates. ADI data is available at a much higher frequency and available at a stage that re-work of substrates still makes sense (removing resist layer, applying new resist layer and continuing with exposure).

In an embodiment a method of is provided comprising a step of densifying the overlay data comprised within the first metrology data to obtain densified overlay data having at least values for positions across the one or more substrates associated with the overlay data comprised within the second metrology data.

In an embodiment an estimated contribution of an etching step comprises subtracting the densified overlay data from the overlay data comprised within the second metrology data.

In an embodiment a method for determining a plurality of additional etch process contributions is provided, the method comprising: estimating the contribution of the etching step separately for different first and second metrology data sets, each set associated with a different etch chamber and/or etch tool out of a plurality of etch chambers and/or etch tools used in performing the etching step; and determining a plurality of etch process contributors based on the separately determined estimated contributions.

In an embodiment the method further comprises determining of a KPI based on the overlay data comprised within the first metrology data and an etch process contribution comprised within the plurality of etch process contributions.

In an embodiment the etch process contribution is associated with an etch chamber and/or etch tool expected to be used in a future processing step.

In an embodiment the etch process contribution is selected out of the plurality of etch process contributions based on the value of the KPI being determined based on the overlay data comprised within the first metrology data and the etch process contribution.

In an embodiment the value is a minimum or maximum among a list of KPI values, each KPI value out of the list determined by using the overlay data comprised within the first metrology data and each out of the plurality of etch process contributions.

In an embodiment a method of evaluating the quality of a substrate associated with first metrology data based on measurements performed after a first processing step is provided, the method comprising: using any method to determine a KPI associated with the first metrology data; and determining the quality of the substrate based on the determined KPI.

In an embodiment the determined KPI is used for deciding to rework the substrate.

In an embodiment the KPI relates to a probability of the substrate having a yield exceeding a certain threshold, for example 95%.

According to another aspect of the invention the first metrology data relates to alignment data associated with one or more substrates. For example the first metrology data may be relatively sparse alignment data comprising measured positions of alignment marks (typically performed by the alignment system of the lithographic apparatus). The second metrology data may be related to either dense overlay measurements or dense In-Plane-Distortion (IPD) data derived from substrate height map data. Both data sources are typically combined and subsequently used for controlling a lithographic apparatus when exposing one or more substrates for which the first and second metrology data is representative. For example the controlling may combine substrate specific (sparse) alignment data and dense overlay data (for example used in APC control) to control positioning of the substrate during exposure of said substrate.

In current lithographic apparatuses it is common that an external control interface is provided for receiving external metrology data (often dense overlay data) in order to enable a controller of the lithographic apparatus to correct CD, overlay or other processing related parameters. The controller may receive input from independently operating metrology systems, for example a first metrology system configured to provide alignment data and a second metrology system configured to provide dense overlay data to the external control interface. In this example the controller receives first metrology data generated by the lithographic apparatus itself (alignment data, not provided to the external control interface but handled internally by the lithographic apparatus) and second metrology data (dense overlay) as provided to the external control interface.

As both the first and second metrology data may contain common components there is intrinsically a risk that the controller combines the first and second metrology data such that the resulting control action (correction) leads to undesired overcorrecting behavior. This may be prevented by subtracting from the second metrology data a modeled correction associated with the effect of the controller when operating on the first metrology data. For example the first metrology data (alignment data) may be modeled (alignment model) and evaluated on a grid associated with the second metrology data and subsequently the modeled first metrology data may be subtracted from the second metrology data (dense overlay data) prior to using the second metrology data as input for the external control interface.

However the method as described above has some disadvantages: 1) the model used in describing the first metrology data (correction) is not always available at the moment of providing the second metrology data to the external interface as selection of the alignment model may be dynamic (based on first metrology data characteristics) and hence only be available at a point in time when it is too late to modify the second metrology data and 2) the first metrology data may be so sparse that modeled components may be determined quite inaccurately (e.g. aliasing effects making linear components becoming dependent on selected measurement positions and not so much reflecting true linear behavior of first metrology data cross the substrate of interest).

It is proposed to overcome the mentioned disadvantages by using the second metrology data to correct the first metrology data first, for example by subtracting the (modeled) second metrology data (dense overlay data as provided to the external control interface) from the first metrology data (sparse alignment data). Subsequently the corrected first metrology data may be modeled, for example by fitting the corrected first metrology data to a model (alignment model) associated with the first metrology data (sparse alignment data). Finally the second metrology data (dense overlay data) is combined with (added to) the modeled corrected first metrology data to obtained data suitable for the controller.

The proposed method does not rely on any knowledge on the model used in modeling the first metrology data (solving disadvantage 1) and further the alignment model is used on sparse data which is corrected by dense data content reducing significantly aliasing effects (solving disadvantage 2). The method effectively provides in an improved control interface communicating an expected wafer deformation (IPD), based on either pre-exposure measurement of a substrate height map (preferably the same substrate on which the alignment data is measured) or dense overlay data based on for example measurement data configured to enable an APC control strategy, to the part of the controller of the lithographic apparatus that combines the external metrology data and the internal metrology data (alignment).

In an embodiment a method of configuring a semiconductor manufacturing process is disclosed, the method comprising: obtaining first metrology data based on measurements performed within a processing apparatus; obtaining second metrology data provided to an external control interface of the processing apparatus; using the second metrology data to correct the first metrology data to obtain corrected first metrology data; modeling the corrected first metrology data; and combining the modeled corrected first metrology data and the second metrology data to configure the processing apparatus.

In an embodiment the first metrology data is alignment data, the second metrology data is dense substrate in-plane deformation (IPD) data and the processing apparatus is a lithographic apparatus.

In an embodiment the first metrology data is alignment data, the second metrology data is dense overlay data and the processing apparatus is a lithographic apparatus.

In an embodiment the using the second metrology data comprises subtracting the second metrology data from the first metrology data.

In an embodiment the modeling uses an alignment model.

In an embodiment the configuring is providing input to a controller of the processing apparatus.

In an embodiment the controller is configured to correct positioning of a substrate subject to a lithographic process.

Alternatively the invention can considered as a method to combine (sparse) alignment data as measured on a current substrate before a lithographic exposure and subsequent resist development step with (dense) overlay data as measured on one or more previous substrates having already been subject to said lithographic exposure and resist development step. Typically the overlay data is used to derive a control action for improving (overlay of) the lithographic exposure of the current substrate. To prevent over-correction it is important to estimate the contribution of the control action to the lithographic exposure (process) in combination with the obtained alignment data before deriving a final correction for the lithographic exposure of the current substrate.

In an embodiment a method of controlling a semiconductor manufacturing process is disclosed, the method comprising: obtaining first metrology data based on measurements performed after a first process step; obtaining second metrology data based on measurements performed after the first process step and at least one additional process step; estimating a contribution to the process of a control action which is at least partially based on the second metrology data; and determining a correction for the first process step using the first metrology data and the estimated contribution, wherein the first metrology data is alignment data and the second metrology data is overlay data or dense substrate in-plane deformation (IPD) data.

Further embodiments of the invention are disclosed in the list of numbered clauses below:

1. A method of controlling a semiconductor manufacturing process, the method comprising:
   obtaining first metrology data based on measurements performed after a first process step;
   obtaining second metrology data based on measurements performed after the first process step and at least one additional process step;
   estimating a contribution to the process of: a) a control action which is at least partially based on the second metrology data and/or b) the at least one additional process step by using at least partially the second metrology data; and
   determining a Key Performance Indicator (KPI) or a correction for the first process step using the first metrology data and the estimated contribution.
2. The method of clause 1, wherein the first and second metrology data comprise overlay data measured on one or more substrates being subject to the process.
3. The method of clause 2, wherein the first process step is development of a photosensitive resist applied to the one or more substrates and the at least one additional process step comprises at least an etching, polishing or cleaning step performed on the one or more substrates.
4. The method of clause 3, wherein the overlay data comprised within the first metrology data is distributed sparsely across the one or more substrates compared to the overlay data comprised within the second metrology data.
5. The method of clause 4, wherein the estimated contribution is associated with the control action and wherein the estimating comprises mapping the expected effect of the control action to a grid layout associated with the first metrology data and the determining of the KPI comprises subtracting the mapped effect of the control action from the overlay data comprised within the first metrology data.
6. The method of clause 5, wherein the estimating of the contribution to the process of the control action takes the correction potential of an apparatus, for example a lithographic apparatus, used in the first process step into account.
7. The method of clause 5 or 6, further comprising configuring the process using overlay data obtained by subtracting the mapped effect of the control action from the overlay data comprised within the first metrology data.
8. The method of clause 4, wherein the estimated contribution is associated with the control action and wherein the estimating comprises modeling the expected effect of the control action to a high order modeled fingerprint and the determining of the KPI comprises correcting the overlay data comprised within the first metrology data using the high order modeled fingerprint.
9. The method of clause 7, further comprising configuring the process using the corrected overlay data obtained by correcting the overlay data comprised within the first metrology data using the high order modeled fingerprint.
10. The method of any preceding clause, wherein the first metrology data is input for a first model used in controlling the process and the second metrology data is input for a second model used in controlling the process.
11. The method of clause 10, wherein the first model describes a global fingerprint of a parameter across a substrate and the second model describes a local fingerprint of the parameter across a region of the substrate.
12. The method of clause 11, wherein the region is a field on the substrate.
13. The method of clause 4, further comprising a step of densifying the overlay data comprised within the first metrology data to obtain densified overlay data having at least values for positions across the one or more substrates associated with the overlay data comprised within the second metrology data.
14. The method of clause 13, wherein the estimated contribution is associated with the etching step and the estimating the contribution comprises subtracting the densified overlay data from the overlay data comprised within the second metrology data.
15. A method for determining a plurality of additional etch process contributions, the method comprising:
   using the method of clause 13 separately for different first and second metrology data sets, each set associated with a different etch chamber and/or etch tool out of a plurality of etch chambers and/or etch tools used in performing the etching step; and
   determining the plurality of etch process contributors based on the separately determined estimated contributions.
16. The method of clause 15, further comprising determining the KPI based on the overlay data comprised within the first metrology data and an etch process contribution comprised within the plurality of etch process contribution as determined by the method of clause 15.

17. The method of clause 16, wherein the etch process contribution is associated with an etch chamber and/or etch tool expected to be used in a future processing step.
18. The method of clause 16, wherein the etch process contribution is selected out of the plurality of etch process contributions based on the value of the KPI being determined based on the overlay data comprised within the first metrology data and the etch process contribution.
19. The method of clause 17, wherein the value is a minimum or maximum among a list of KPI values, each KPI value out of the list determined by using the overlay data comprised within the first metrology data and each out of the plurality of etch process contributions.
20. A method of evaluating the quality of a substrate associated with first metrology data based on measurements performed after a first processing step, the method comprising: using the method of clause 19 to determine a KPI associated with the first metrology data; and
determining the quality of the substrate based on the determined KPI.
21. The method of clause 20, further comprising: deciding to rework the substrate based on the determined KPI.
22. The method of clause 20, wherein the KPI relates to a probability of the substrate having a yield exceeding a certain threshold, for example 95%.
23. A method of configuring a processing apparatus, the method comprising:
a. obtaining first metrology data based on measurements performed within the processing apparatus;
b. obtaining second metrology data provided to an external control interface of the processing apparatus;
c. using the second metrology data to correct the first metrology data to obtain corrected first metrology data;
d. modeling the corrected first metrology data; and
e. combining the modeled corrected first metrology data and the second metrology data to configure the processing apparatus.
24. The method of clause 23, wherein the first metrology data is alignment data, the second metrology data is dense substrate in-plane deformation (IPD) data and the processing apparatus is a lithographic apparatus.
25. The method of clause 23, wherein the first metrology data is alignment data, the second metrology data is dense overlay data and the processing apparatus is a lithographic apparatus.
26. The method of any preceding clause, wherein the using the second metrology data comprises subtracting the second metrology data from the first metrology data.
27. The method of any preceding clause, wherein the modeling uses an alignment model.
28. The method of any preceding clause, wherein the configuring is providing input to a controller of the processing apparatus.
29. The method of clause 28, wherein the controller is configured to correct positioning of a substrate subject to a lithographic process.
30. A computer program product comprising computer readable instructions configured to implement the method of any of clauses 1 to 22.
31. A computer program product comprising computer readable instructions configured to implement the method of any of clauses 23 to 29.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A method for controlling a semiconductor manufacturing process, the method comprising:
obtaining first metrology data based on measurements performed after a first process step and before at least one additional process step;
obtaining second metrology data based on measurements performed after the first process step and the at least one additional process step;
estimating a contribution to the process of: a) a control action which is at least partially based on the second metrology data and/or b) the at least one additional process step by using at least partially the second metrology data;
determining a Key Performance Indicator (KPI) or a correction for the first process step, using the first metrology data and the estimated contribution; and
correcting, optimizing or otherwise configuring the process based on the KPI or the correction and/or providing a signal representing, or based on, the KPI or the correction to a tool or a system for use by the tool or the system in correction, optimization or other configuration of the process,
wherein the data comprised within the first metrology data is distributed less densely across the one or more substrates compared to the data comprised within the second metrology data.
2. The method of claim 1, wherein the first and second metrology data comprise overlay data measured on one or more substrates being subject to the process.
3. The method of claim 1, wherein the first metrology data comprises alignment data associated with a first layer on a current substrate and the second metrology data comprises overlay data associated with at least one second layer applied subsequently to the first layer on one or more previous substrates.

4. The method of claim 3, wherein the first process step is development of a photosensitive resist applied to the one or more substrates and the at least one additional process step comprises at least an etching, polishing or cleaning step performed on the one or more substrates.

5. The method of claim 2, wherein the estimated contribution is associated with the control action and wherein the estimating comprises mapping an expected effect of the control action to a grid layout associated with the first metrology data and the determining of the KPI or the correction comprises subtracting the mapped effect of the control action from the overlay data comprised within the first metrology data.

6. The method of claim 5, wherein the estimating of the contribution to the process of the control action takes a correction potential of an apparatus used in the first process step into account.

7. The method of claim 5, further comprising configuring the process using overlay data obtained by subtracting the mapped effect of the control action from the overlay data comprised within the first metrology data.

8. The method of claim 2, wherein the estimated contribution is associated with the control action and wherein the estimating comprises modeling an expected effect of the control action to a high order modeled fingerprint and the determining of the KPI or the correction comprises correcting the overlay data comprised within the first metrology data using the high order modeled fingerprint.

9. The method of claim 8, further comprising configuring the process using the corrected overlay data obtained by correcting the overlay data comprised within the first metrology data using the high order modeled fingerprint.

10. The method of claim 1, wherein the first metrology data is input for a first model used in controlling the process and the second metrology data is input for a second model used in controlling the process.

11. The method of claim 10, wherein the first model describes a fingerprint of a parameter across an area of a substrate and the second model describes a fingerprint of the parameter across a region, smaller than the area, of the substrate.

12. The method of claim 11, wherein the region is a field on the substrate.

13. The method of claim 2, further comprising densifying the overlay data comprised within the first metrology data to obtain densified overlay data having at least values for positions across the one or more substrates associated with the overlay data comprised within the second metrology data.

14. The method of claim 1, wherein the first metrology data is alignment data and the second metrology data is dense substrate in-plane deformation (IPD) data.

15. A computer program product comprising a non-transitory computer-readable medium having instructions therein, the instructions, when executed by a computer system, configured to cause the computer system to at least:
obtain first metrology data based on measurements performed after a first process step of a process and before at least one additional process step;
obtain second metrology data based on measurements performed after the first process step and the at least one additional process step;
estimate a contribution to the process of: a) a control action which is at least partially based on the second metrology data and/or b) the at least one additional process step by using at least partially the second metrology data;
determine a Key Performance Indicator (KPI) or a correction for the first process step using the first metrology data and the estimated contribution; and
cause correction, optimization or other configuration of the process based on the KPI or the correction and/or provide a signal representing, or based on, the KPI or the correction to a tool or a system for use by the tool or the system in correction, optimization or other configuration of the process,
wherein the data comprised within the first metrology data is distributed less densely across the one or more substrates compared to the data comprised within the second metrology data.

16. The computer program product of claim 15, wherein the first metrology data comprises alignment data associated with a first layer on a current substrate and the second metrology data comprises overlay data associated with at least one second layer applied subsequently to the first layer on one or more previous substrates.

17. A method for configuring a processing apparatus, the method comprising:
obtaining first metrology data based on measurements performed within the processing apparatus;
obtaining second metrology data provided to an external control interface of the processing apparatus;
using the second metrology data to correct the first metrology data to obtain corrected first metrology data;
modeling the corrected first metrology data; and
combining the modeled corrected first metrology data and the second metrology data to configure the processing apparatus.

18. The method of claim 17, wherein the first metrology data is alignment data, the second metrology data is dense substrate in-plane deformation (IPD) data and the processing apparatus is a lithographic apparatus.

19. The method of claim 17, wherein the first metrology data is alignment data, the second metrology data is dense overlay data and the processing apparatus is a lithographic apparatus.

20. A computer program product comprising a non-transitory computer-readable medium having instructions therein, the instructions, when executed by a computer system, configured to cause the computer system to at least:
obtain first metrology data based on measurements performed within a processing apparatus;
obtain second metrology data provided to an external control interface of the processing apparatus;
use the second metrology data to correct the first metrology data to obtain corrected first metrology data;
model the corrected first metrology data; and
combine the modeled corrected first metrology data and the second metrology data to configure the processing apparatus.

* * * * *